(12) United States Patent
Tonkikh et al.

(10) Patent No.: US 10,923,629 B2
(45) Date of Patent: Feb. 16, 2021

(54) RADIATION-EMITTING SEMICONDUCTOR BODY AND METHOD OF PRODUCING A SEMICONDUCTOR LAYER SEQUENCE

(71) Applicant: OSRAM Opto Semiconductors GmbH, Regensburg (DE)

(72) Inventors: Alexander Tonkikh, Wenzenbach (DE); Peter Stauss, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/348,662

(22) PCT Filed: Nov. 22, 2017

(86) PCT No.: PCT/EP2017/080035
§ 371 (c)(1),
(2) Date: May 9, 2019

(87) PCT Pub. No.: WO2018/099781
PCT Pub. Date: Jun. 7, 2018

(65) Prior Publication Data
US 2019/0280159 A1    Sep. 12, 2019

(30) Foreign Application Priority Data

Dec. 1, 2016  (DE) .................. 10 2016 123 262

(51) Int. Cl.
*H01L 33/30* (2010.01)
*H01L 33/00* (2010.01)
*H01L 33/06* (2010.01)

(52) U.S. Cl.
CPC ........ *H01L 33/305* (2013.01); *H01L 33/0062* (2013.01); *H01L 33/06* (2013.01)

(58) Field of Classification Search
None
See application file for complete search history.

(56) References Cited

U.S. PATENT DOCUMENTS 6,479,836 B1    11/2002  Suzuki et al.
2003/0230755 A1  12/2003  Onishi
(Continued)

FOREIGN PATENT DOCUMENTS

DE  10 2007 020 291 A1   8/2008
DE  10 2013 104 272 A1  10/2014
(Continued)

OTHER PUBLICATIONS

J. Pohl etal., "Combined Mg/Zn p-type doping for AlGaInP laser diodes," Journal of Crystal Growth, vol. 414, 2015, pp. 215-218.
Notice of Reasons for Refusal dated May 19, 2020, of counterpart Japanese Application No. 2019-528695, along with an English Summary and English Translation.

*Primary Examiner* — Robert K Carpenter
(74) *Attorney, Agent, or Firm* — DLA Piper LLP (US)

(57) ABSTRACT

A radiation-emitting semiconductor body includes a semiconductor layer sequence including an active region that generates radiation, an n-conducting semiconductor layer and a p-conducting semiconductor layer, wherein the active region is arranged between the n-conducting semiconductor layer and the p-conducting semiconductor layer and the p-conducting semiconductor layer includes a first doping region with a first dopant and a second doping region with a second dopant different from the first dopant, and the p-conducting semiconductor layer includes a further doping region doped with the first dopant and has a thickness of at most 2 nm.

17 Claims, 4 Drawing Sheets

(56) References Cited

U.S. PATENT DOCUMENTS

| | | |
|---|---|---|
| 2005/0271104 A1 | 12/2005 | Ono et al. |
| 2007/0045651 A1 | 3/2007 | Suzuki |
| 2015/0171263 A1* | 6/2015 | Nakatsu .............. H01L 33/0025 257/13 |
| 2015/0200328 A1 | 7/2015 | Tangring et al. |
| 2015/0270433 A1 | 9/2015 | Lai et al. |
| 2015/0349197 A1* | 12/2015 | Watanabe ............... H01L 33/06 257/13 |

FOREIGN PATENT DOCUMENTS

| | | |
|---|---|---|
| JP | H04-218994 A | 8/1992 |
| JP | H09-97945 A | 4/1997 |
| JP | 2001-060720 A | 3/2001 |
| JP | 2004-079644 A | 3/2004 |
| JP | 2005-277342 A | 10/2005 |
| JP | 2005-353654 A | 12/2005 |
| JP | 2009-158818 A | 7/2009 |
| JP | 2015-529974 A | 10/2015 |
| WO | 2006/068378 A1 | 6/2006 |

\* cited by examiner

RADIATION-EMITTING SEMICONDUCTOR BODY AND METHOD OF PRODUCING A SEMICONDUCTOR LAYER SEQUENCE

TECHNICAL FIELD

This disclosure relates to a radiation-emitting semiconductor body and to a method of producing a semiconductor layer sequence.

BACKGROUND

In radiation-emitting semiconductor components such as, for example, light-emitting diodes in the visible spectral range, leakage currents can impair their efficiency. One of the main causes of this is that electrons at the region between the active region provided to generate radiation and the p-conducting region penetrate into the p-conducting region on account of a potential barrier that is too low and recombine there in a non-radiating manner. This effect increases with increasing operating temperature.

By using semiconductor material having a large band gap compared to the material of the active region, only some of the electrons can be kept away from penetration into the p-conducting region. In addition, in material systems such as AlInGaP, it is often no longer possible to achieve an even higher band gap by adapting the proportions of the group III elements for the p-conducting region, and thus a sufficiently high potential barrier.

It could therefore be helpful to provide a semiconductor body distinguished by high efficiency and a method by which a semiconductor layer sequence, in particular for such a semiconductor body, can be produced efficiently and reliably.

SUMMARY

We provide a radiation-emitting semiconductor body including a semiconductor layer sequence including an active region that generates radiation, an n-conducting semiconductor layer and a p-conducting semiconductor layer, wherein the active region is arranged between the n-conducting semiconductor layer and the p-conducting semiconductor layer and the p-conducting semiconductor layer includes a first doping region with a first dopant and a second doping region with a second dopant different from the first dopant, and the p-conducting semiconductor layer includes a further doping region doped with the first dopant and has a thickness of at most 2 nm.

We also provide a method of producing a semiconductor layer sequence including a) providing a substrate; and b) growing a semiconductor layer sequence including an active region that generates radiation, an n-conducting semiconductor layer and a p-conducting semiconductor layer, wherein the active region is arranged between the n-conducting semiconductor layer and the p-conducting semiconductor layer and the p-conducting semiconductor layer includes a first doping region with a first dopant and a second doping region with a second dopant different from the first dopant, and the p-conducting semiconductor layer includes a further doping region doped with the first dopant and has a thickness of at most 2 nm.

We further provide a radiation-emitting semiconductor body including a semiconductor layer sequence including an active region that generates radiation, an n-conducting semiconductor layer and a p-conducting semiconductor layer, wherein the active region is arranged between the n-conducting semiconductor layer and the p-conducting semiconductor layer and the p-conducting semiconductor layer includes a first doping region with a first dopant and a second doping region with a second dopant different from the first dopant, and the second doping region is at least five times as thick as the first doping region, and the first doping region and the second doping region directly adjoin one another.

REFERENCE NUMERALS 1 semiconductor body
2 semiconductor layer sequence
20 active region
201 quantum layer
202 barrier layer
21 n-conducting semiconductor layer
22 p-conducting semiconductor layer
221 first doping region
222 second doping region
223 contact layer
225 further first doping region
5 substrate
61 measurement result
62 reference result
66 curve
67 curve
71 curve
72 curve
73 curve

DETAILED DESCRIPTION

Our radiation-emitting semiconductor body has a semiconductor layer sequence. The semiconductor layer sequence is, in particular, deposited epitaxially, for example, by MOCVD.

The semiconductor layer sequence may comprise an active region provided to generate radiation, an n-conducting semiconductor layer and a p-conducting semiconductor layer. The active region is arranged in particular between the n-conducting semiconductor layer and the p-conducting semiconductor layer. The active region, the n-conducting semiconductor layer and the p-conducting semiconductor layer can each be formed in one or more layers. For example, the active region comprises a quantum structure.

The term quantum structure comprises, in particular, any structure in which charge carriers can experience a quantization of their energy states by confinement. In particular, the term quantum structure does not contain any indication about the dimensionality of the quantization. It thus comprises, inter alia, quantum wells, quantum wires, quantum rods and quantum dots and any combination of these structures.

The p-conducting semiconductor layer may comprise a first doping region with a first dopant. A thickness of the first doping region, that is to say an extent of the first doping region in a direction perpendicular to a main plane of extension of the semiconductor layers of the semiconductor layer sequence, is, for example, small compared to the total thickness of the p-conducting semiconductor layer. For example, the thickness of the first doping region has at most 5% of the thickness of the p-conducting semiconductor layer.

The p-conducting semiconductor layer may comprise a second doping region with a second dopant different from the first dopant. The thickness of the second doping region is, for example, large compared to the thickness of the first doping region. For example, the second doping region is at least five times as thick or at least ten times as thick as the first doping region.

The semiconductor body may comprise a semiconductor layer sequence comprising an active region provided to generate radiation, an n-conducting semiconductor layer and a p-conducting semiconductor layer. The active region is arranged between the n-conducting semiconductor layer and the p-conducting semiconductor layer, and the p-conducting semiconductor layer comprises a first doping region with a first dopant and a second doping region with a second dopant different from the first dopant.

The first doping region may have a thickness of at most 5 nm, for example, of at most 2 nm. By way of example, the first doping region has a thickness between including one monolayer and five atomic layers. In particular, the first doping region forms a region of the p-conducting semiconductor layer in which the doping is high, for example, at least twice as high as in a semiconductor material adjoining at least on one side of the first doping region.

In particular, the semiconductor material adjoining both sides of the first doping region is free of the first dopant or substantially free of the first dopant. In this context, "substantially free" means in particular that the concentration of the first dopant in the adjoining semiconductor material, in particular in the second doping region, is at most 10% of the value in the first doping region.

The first dopant and the second dopant each bring about a p-type doping. The first dopant and the second dopant are thus different from one another with respect to the material, but in both cases lead to p-doping. In other words, both the first dopant and the second dopant act as an acceptor.

The first dopant and the second dopant are, for example, spatially separated from one another in the vertical direction so that the first doping region (apart from a marginal diffusion of the second dopant) contains only the first dopant and the second doping region (apart from a marginal diffusion of the first dopant) contains only the second dopant.

The semiconductor body may be based on a III-V compound semiconductor material. In particular, the semiconductor body is based on the compound semiconductor material system $Al_x In_y Ga_{1-x-y} P_z As_{1-z}$ with $0<=x<=1$, $0<=y<=1$, $x+y<=1$ and $0<=z<=1$. This material system is particularly suitable for generating radiation having a wavelength from the red over the yellow to the green spectral range. "Based on" means that at least one layer of the semiconductor body, for example, all layers of the semiconductor body, comprise such a material or consist of such a material. In this example, this material does not necessarily have to have a mathematically exact composition according to the above formula. Rather, it can have, for example, one or more dopants and additional constituents. For the sake of simplicity, however, the above formula only includes the essential components of the crystal lattice (Al, Ga, In, As, P), even if these can be partially replaced and/or supplemented by small quantities of further substances.

The first dopant may be incorporated on group V lattice points. For example, the first dopant is a group IV element so that the first dopant acts as an acceptor.

The first dopant may be carbon. We found that carbon is distinguished by a very small diffusion in the semiconductor body so that the first doping region can have a high doping concentration and at the same time a small thickness. For example, doping concentrations of $1\times10^{19}$ $cm^{-3}$ or more can be achieved with carbon. In contrast, concentrations of at most $5\times10^{18}$ $cm^{-3}$ are typically achieved with the usual p-type dopants magnesium or zinc.

The second dopant may be incorporated on group III lattice points. For example, the second dopant is a group II element such as magnesium or zinc.

The first doping region may be arranged between the active region and the second doping region. By the first doping region, penetration of electrons into the second doping region can be suppressed or at least reduced during operation of the semiconductor body. For example, the first doping region adjoins the active region directly. In an active region having one or more quantum layers, the first doping region can directly adjoin the closest quantum layer or be spaced apart from the closest quantum layer.

The first doping region and the second doping region may adjoin one another directly. In particular, the first doping region and the second doping region are arranged one above the other in the vertical direction.

For example, the first doping region and the second doping region have essentially the same composition with respect to the group III elements and/or the group V elements. In other words, the first doping region and the second doping region differ substantially by the dopant introduced into the respective region. For example, the percentages of the group III elements, for example, Al, Ga, In, in the first doping region differ by at most 5 percentage points from the respective percentages in the second doping region. For the Al content, this means by way of example $|x_1-x_2|<=0.05$, wherein $x_1$ is the Al content in the first doping region and $x_2$ is the Al content in the second doping region. This applies analogously to the remaining group III elements, in particular to the In content y.

The first doping region may form a charge carrier barrier for electrons. We found that, by the doping concentration which is spatially delimited in the vertical direction and at the same time high, an efficient charge barrier can be achieved in the first doping region. In particular, in contrast to conventional charge carrier barriers, this charge carrier barrier is not achieved by varying the group III elements of the semiconductor material, but exclusively or at least predominantly on account of the comparatively high doping concentration.

The p-conducting semiconductor layer may comprise a further first doping region doped with the first dopant. The further first doping region can in particular have one or more of the features named in connection with the first doping region. For example, the further first doping region has a thickness of at most 2 nm. The first doping region and the further first doping region are spaced apart from one another in the vertical direction. A distance between the first doping region and the further first doping region is, for example, at most 5 nm. The p-conducting semiconductor layer can also comprise a plurality of first doping regions.

Furthermore, a method of producing a semiconductor layer sequence is provided.

A substrate may be provided and a semiconductor layer sequence comprising an active region provided to generate beams, an n-conducting semiconductor layer and a p-conducting semiconductor layer is grown. The active region is arranged between the n-conducting semiconductor layer and the p-conducting semiconductor layer, and the p-conducting semiconductor layer comprises a first doping region with a first dopant and a second doping region with a second dopant different from the first dopant.

In particular, nominally the first dopant is provided only in the first doping region and the second dopant is provided only in the second doping region.

The first doping region may be grown at a temperature of at most 600° C., in particular of at most 580° C.

Until now, it has been assumed in the literature that efficient p-doping cannot be achieved by carbon. However, we found that introduction of the first dopant, in particular carbon as the first dopant, can be carried out efficiently below this temperature, for example, at 560° C. or 540° C. In contrast, no efficient incorporation of carbon is achieved at conventional growth temperatures such as 700° C. for AlInGaP.

The growth temperature can be increased for deposition of the second doping region, for example, to 700° C.

Furthermore, deposition of the active region can also be carried out at a higher temperature than deposition of the first doping region. A reduction of the growth temperature for formation of the first doping region can thus take place temporarily between deposition of the active region and the second doping region.

The semiconductor layer sequence is based in particular on a III-V compound semiconductor material, for example, AlInGaAsP.

The first doping region may be formed at a low III-V ratio. This reduced ratio increases the efficiency of incorporation of the first dopant, in particular at group IV lattice points. For example, the III-V ratio is at least ten times lower or at least 100 times lower than during the deposition of the active region and/or of the second doping region.

To produce the first doping region, exclusively gas with the first dopant is supplied without feeding a further gas for the group III atoms and group V atoms. In this way, particularly high concentrations of the first dopant in the first doping region can be achieved.

It is also possible to combine two or more than two of the measures for an efficient installation of the first dopant, for example, the reduced growth temperature and the low III-V ratio or the reduced growth temperature, and the exclusive supply of gas with the first dopant.

The method described is particularly suitable for producing a semiconductor layer sequence for a semiconductor body described above. Features listed in connection with the semiconductor body can therefore also be used for the method and vice versa.

Further configurations and expediencies emerge from the following description of the examples in conjunction with the figures.

Identical, similar or identically acting elements are provided with the same reference symbols in the figures.

The figures are each schematic representations and are therefore not necessarily to scale. Rather, comparatively small elements and in particular layer thicknesses can be represented exaggeratedly large for clarification.

Figure 1A:
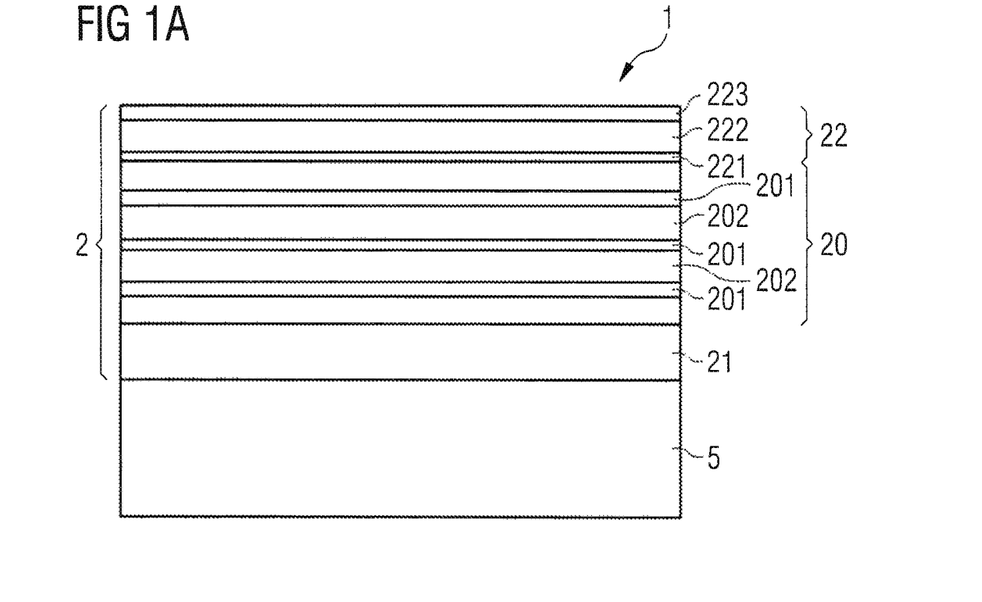
FIG. 1A shows an example of a semiconductor body in a schematic sectional view.

FIG. 1A shows an example of a semiconductor body 1. The semiconductor body comprises a semiconductor layer sequence 2. The semiconductor layer sequence is arranged on a substrate 5, for example, a growth substrate for an epitaxial deposition of the semiconductor layer sequence 2.

The semiconductor layer sequence 2 comprises an active region 20 provided to generate radiation arranged between an n-conducting semiconductor layer 21 and a p-conducting semiconductor layer 22. A radiation-emitting component formed by the semiconductor body such as, for example, a light-emitting diode semiconductor chip, advantageously comprises an externally accessible electrical contact to electrically contact the n-conducting semiconductor layer 21 and the p-conducting semiconductor layer 22 so that charge carriers can be injected from opposite sides into the active region 20 by applying an external electrical voltage between the contacts and recombine there under emission of radiation. These contacts are not explicitly shown for simplified representation.

The active region 20 comprises a quantum structure having a plurality of quantum layers 201 and barrier layers 202 arranged therebetween. Three quantum layers are shown by way of example in the figure. However, the active region can also comprise only one or two quantum layers or more than three quantum layers.

The p-conducting semiconductor layer 21 comprises a first doping region 221 with a first dopant. For example, the first dopant is carbon. Carbon acts as an acceptor by a building-in at group-V grid points.

The p-conducting semiconductor layer 22 furthermore comprises a second doping region 222 having a second dopant different from the first dopant. For example, the second dopant is magnesium or zinc. Magnesium or zinc bring about p-doping by incorporation at group III lattice points.

The following description is carried out on the basis of a semiconductor layer sequence, which is based on the compound semiconductor material system $Al_x In_y Ga_{1-x-y} P_z As_{1-z}$. In this example the following applies $0<=x<=1$, $0<=y<=1$, $x+y<=1$ and $0<=z<=1$. However, the method can also be applied to other compound semiconductor material systems.

Gallium arsenide, for example, is suitable as the growth substrate for the semiconductor layer sequence. In particular $z>=0.9$, for example, $z=1$ applies to the active region.

Alternatively, however, another semiconductor material, in particular a different III-V compound semiconductor material, can also be used.

The first doping region 221 has a comparatively small thickness compared to the second doping region 222. For example, the second doping region is at least five times as thick or at least ten times as thick as the first doping region 221.

The first doping region 221 is arranged between the active region 20 and the second doping region 222. In particular, the first doping region 221 adjoins the active region 20 directly. In the vertical direction, that is to say parallel to the growth direction Z and perpendicular to a main plane of extension of the semiconductor layers of the semiconductor layer sequence, from the n-conducting semiconductor layer 21, viewed in the direction of the active region, the first doping region 221 is thus the first p-conducting semiconductor layer of the semiconductor body 1.

We found that, by suitable selection of the deposition conditions, production of a first doping region 221 doped in particular with carbon can be achieved, which is distinguished by a high two-dimensional areal doping density and can have a small thickness in the vertical direction. For example, the thickness of the first doping region 221 is between including a monolayer and including 2 nm.

In particular, a carbon doping is distinguished such that the carbon atoms do not diffuse or diffuse at least only to a negligible proportion within the semiconductor body. As a result, higher doping concentrations, in particular higher areal doping concentrations, can be achieved than with the conventionally used dopants magnesium and zinc. Carbon is incorporated at group V lattice points and thus acts as an acceptor.

The p-conducting semiconductor layer 22 thus has two doping regions, in each of which a p-type doping is effected, wherein incorporation of the first dopant in the first doping region takes place at group-V lattice points and incorporation of the second dopant in the second doping region 222 takes place at group III lattice points.

In the example shown, the p-conducting semiconductor layer 22 furthermore comprises a contact layer 223 delimiting the semiconductor body in the vertical direction. A semiconductor material having a low phosphorus content, for example, $z \leq 0.1$ or $z=0$ can be used for this contact layer, for example, an AlGaAs semiconductor layer. The contact layer serves in particular for improved electrical contacting of the semiconductor body via a contact (not explicitly illustrated) applied to the semiconductor body.

Figure 1B:
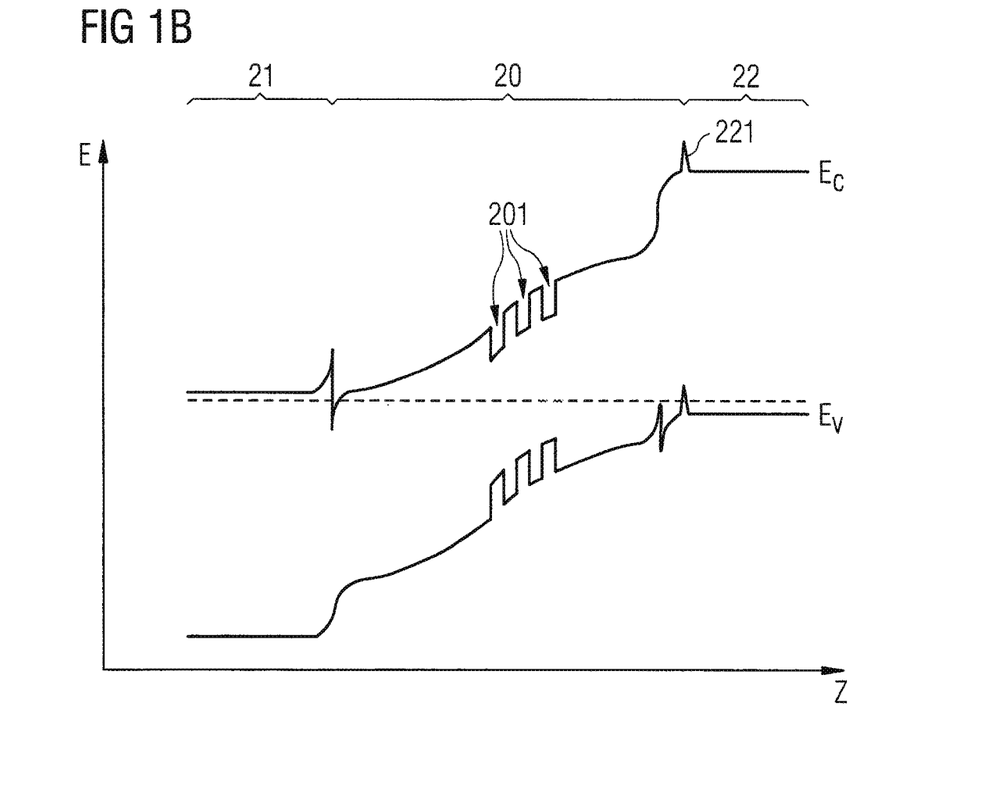
FIG. 1B shows an associated schematic band edge profile of the conduction band $E_C$ and of the valence band $E_V$ along a growth direction Z.

As the band edge profile for the conduction band $E_C$ and the valence band $E_V$ illustrated in FIG. 1B shows, a charge carrier barrier is formed in the conduction band by the first doping region 221, where the charge carrier barrier prevents the electrons from passing from the active region 20 into the p-conducting semiconductor layer 22. As a result, the probability is increased that the charge carriers recombine radiatively in the active region. With regard to the group III components, the first doping region 221 and the material of the second doping region 222 adjoining the first doping region do not have to differ for this purpose.

Figure 2:
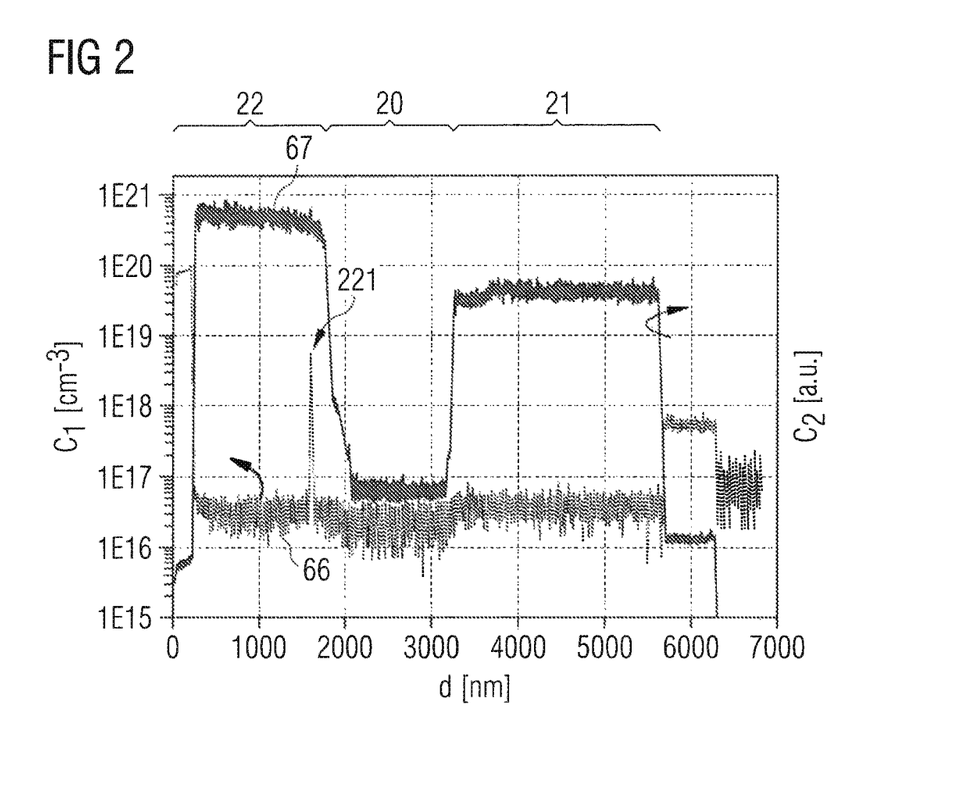
FIG. 2 shows measurement results of a secondary ion mass spectroscopy (SIMS) measurement of a carbon concentration (curve 66) and an aluminum concentration (curve 67) as a function of the penetration depth d, respectively.

In FIG. 2, measurement results of SIMS measurements for the carbon content (curve 66) and the aluminum content (curve 67) are shown. The spatial position of the active region can be clearly seen on the basis of the aluminum content since the latter has a comparatively low Al content. The curve 66 shows that an incorporation of carbon with a high concentration and a small vertical extent along the penetration depth d during the SIMS measurement occurs. In particular, the incorporation takes place in a semiconductor material having a high proportion of phosphorus such as a phosphorus content of $z \geq 0.9$, approximately $z=1$. Until now, it has been assumed that a carbon incorporation in such a semiconductor material cannot be carried out efficiently.

A doping concentration in the first doping region 221 is, for example, $1\times10^{19}$ cm$^{-3}$ to $1\times10^{22}$ cm$^{-3}$, in the example shown in FIG. 2, for example, $3.27\times10^{21}$ cm$^{-3}$. In relation to a thickness of 2 nm, this corresponds to an areal doping density $2\times10^{12}$ cm$^{-2}$ to $2\times10^{15}$ cm$^{-2}$, in the example $6.54\times10^{4}$ cm$^{-2}$.

Figure 3:
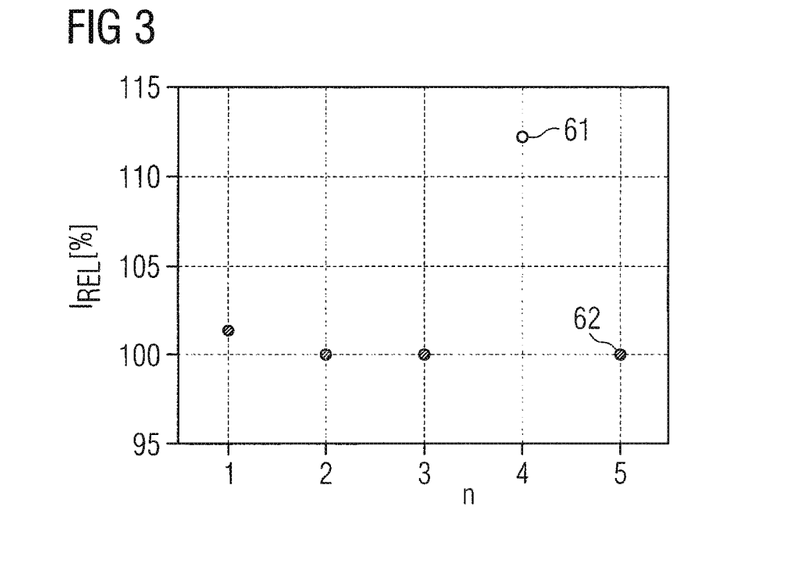
FIG. 3 shows measurement results of a relative intensity $I_{REL}$ of the electroluminescence of a semiconductor body (measurement result 61) and an associated reference result 62 for four reference samples.

FIG. 3 shows a measurement result 61 of an electroluminescence measurement of such a semiconductor layer sequence for a sample n=4, wherein the four further samples are n=1, 2, 3 and 5 respectively provide reference results 62. The samples on which the reference measurement is based differ in that they do not have a first doping region 221. The measurements thus demonstrate that the intensity of the measurement result 61 is more than 10% above the corresponding reference result 62. In semiconductor components produced from such a semiconductor layer sequence, the increase in efficiency also depends, inter alia, on the operating current, as will be described below with reference to FIG. 4.

Figure 4:
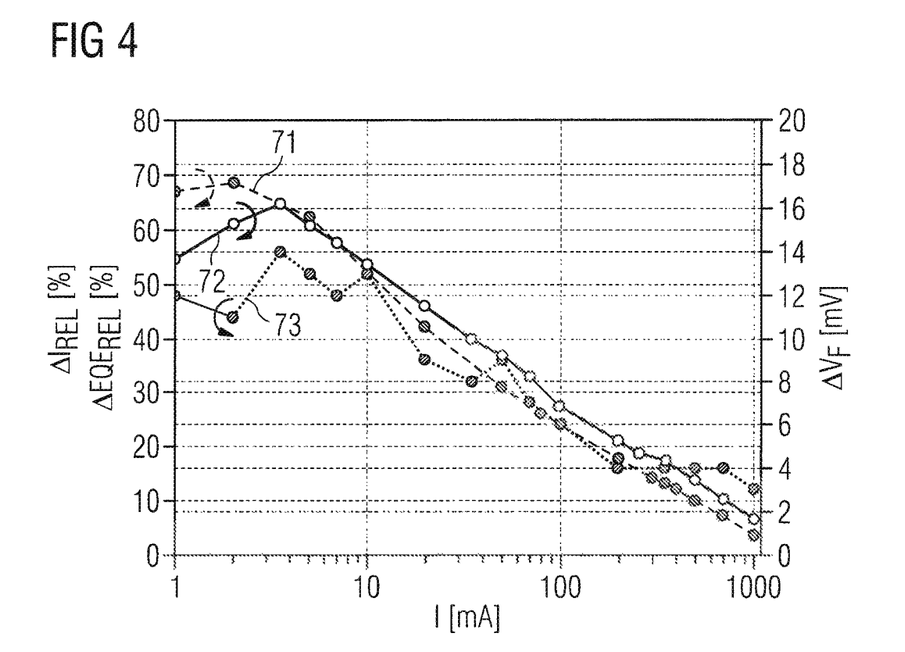
FIG. 4 shows measurement results of the increase in the relative intensity $I_{REL}$ of the electroluminescence, of the increase in the relative external quantum efficiency $EQE_{REL}$ and of the change in the forward bias, each as a function of the applied current.

In FIG. 4, measurement results are shown, which show the increase in the relative intensity $\Delta I_{REL}$ of the electroluminescence as curve 71, the increase in the relative external quantum efficiency $\Delta EQE_{REL}$ as curve 72 and the change in the forward bias $\Delta V_F$, in each case as a function of the applied current as a curve 73.

An averaging over measurements on 2000 LED semiconductor chips having an area of 1 mm$^2$ and an emission wavelength of 590 nm was carried out to determine $\Delta I_{REL}$, wherein the reference samples do not have a first doping region in contrast to the test samples. For $\Delta I_{REL}$ applies $\Delta I_{REL}=(I_T-I_R)/I_R*100\%$, wherein $I_T$ is the averaged intensity of the electroluminescence of the test samples and $I_R$ is the averaged intensity of the electroluminescence of the reference samples.

The following applies accordingly $\Delta EQE_{REL}=(EQE_T-EQE_R)/EQE_R*100\%$, wherein $EQE_T$ is the external quantum efficiency of the test samples averaged over 11 measurements and $EQE_R$ is the external quantum efficiency of the reference samples averaged over 11 measurements.

To determine the increase in the forward bias $\Delta V_f=V_{fT}-V_{fR}$, the forward bias of the test samples $V_{fT}$ and the forward bias of the reference samples $V_{fR}$ were each averaged over 2000 measurements.

The measurements demonstrate that a clear increase results both for the external quantum efficiency and the electroluminescence, wherein the increase in the small currents is stronger than in higher currents. For currents between 1 mA and 10 mA, the increase is each above 50%, in part above 60%.

The forward voltage $V_f$ increases at small currents between 1 mA and 10 mA by approximately 12 mV in the test samples compared to the reference samples. For higher current values, the increase is reduced largely continuously and drops to a value of approximately 6 mV even at currents of 100 mA.

Overall, a considerable increase in the electroluminescence and the external quantum efficiency can thus be achieved with only a slight increase in the forward bias, wherein the increase in efficiency at currents below 100 mA, in particular below 10 mA, is particularly high.

Figure 5:
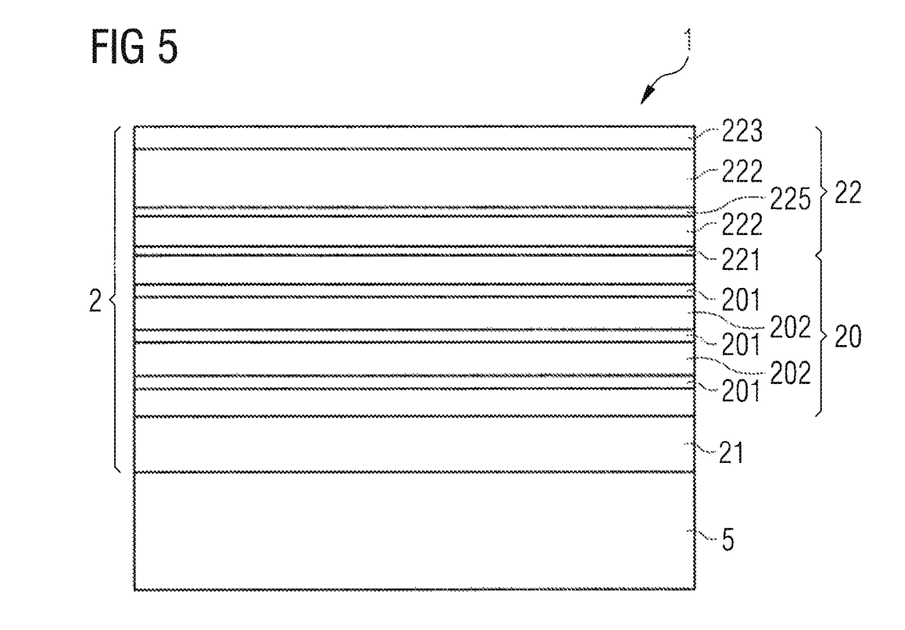
FIG. 5 shows an example of a semiconductor body in a schematic sectional view.

The example shown in FIG. 5 for a semiconductor body corresponds substantially to the example described in connection with FIGS. 1A and 1B. In contrast, the p-conducting semiconductor layer 22 comprises a further first doping region 225 in addition to the first doping region 221 and the second doping region 222. The further first doping region 225 can in particular be formed as described in connection with the first doping region 221. The p-conducting semiconductor layer 22 thus comprises two doping regions with the first dopant, wherein a partial region of the second doping region 222 is arranged between these two doping regions.

A distance between the first doping region 221 and the further first doping region 225 is preferably at most 5 nm.

Such a further first doping region can lead to a reinforcement of the effect of the charge carrier barrier.

Figure 6A:
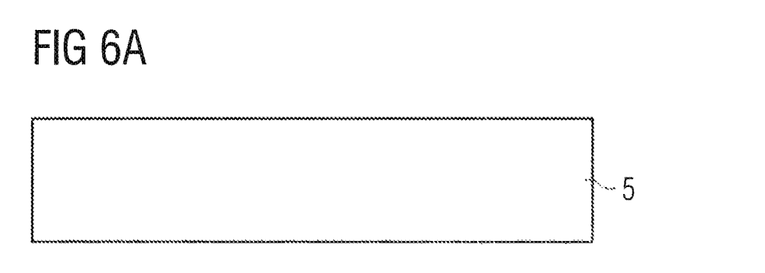
FIGS. 6A and 6B show an example of a method of producing a semiconductor layer sequence on the basis of intermediate steps each illustrated in a schematic sectional view.
Figure 6B:
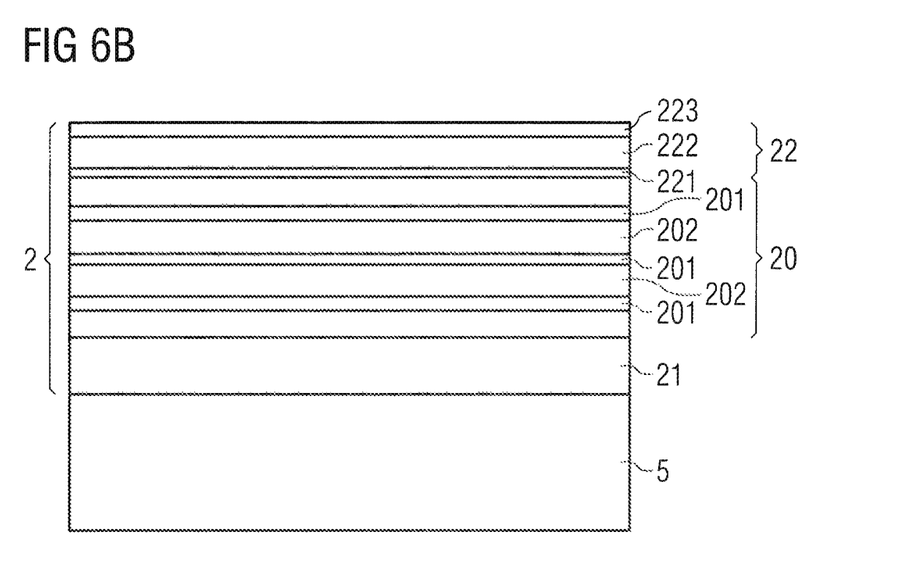

An example of a method of producing a semiconductor layer sequence is shown in FIGS. 6A and 6B. A substrate 5, in particular in the form of a growth substrate, is provided. GaAs is suitable, for example.

A semiconductor layer sequence comprising an active region 20 provided to generate radiation and arranged between an n-conducting semiconductor layer 21 and a p-conducting semiconductor layer 22 is grown on the substrate. The p-conducting semiconductor layer comprises a first doping region 221 with a first dopant and a second doping region 222 with a second dopant different from the first dopant. The deposition parameters during production of the first doping region are selected such that an efficient incorporation of the first dopant takes place.

We found that by comparatively low growth temperatures of at most 600° C., for example, of at most 580° C., approximately 560° C. or 540° C., an efficient incorporation of carbon on group-V lattice points is obtained. In contrast, at conventional deposition temperatures of 700° C. or more for the semiconductor material system AlInGaAs, no efficient incorporation of carbon into the first doping region is achieved.

Alternatively or in addition to reducing the growth temperature, however, other measures can also be carried out to bring about incorporation of the first dopant such as carbon.

For example, the efficiency of incorporation can be achieved by depositing the first doping region 221 at a low III/V ratio. For example, the III-V ratio during the deposition of the first doping region 221 is at least ten times lower or at least 100 times lower than during the deposition of the active region 20 and/or of the second doping region 222.

Alternatively, to produce the first doping region, at least temporarily exclusively gas with the first dopant can be supplied without feeding a further gas for the group—III atoms and the group V atoms (for example, organometallic compounds such as TMA, TMG, TMI or p and As). To produce semiconductor components such as, for example, luminescence diode semiconductor chips, the semiconductor layer sequence can subsequently be processed further to form individual semiconductor bodies.

By way of example, the n-conducting semiconductor layer 21 and the p-conducting semiconductor layer 22 each comprise AlInP, wherein these layers are expediently arranged with respect to the growth substrate, for example, GaAs, lattice-matched or at least almost lattice-matched, for example, with a maximum relative deviation of the lattice constant of 2%. In this example, the phosphorus content is z=1. However, a lower phosphorus content can also be used, for example, z>=0.9.

The efficiency-reducing leakage currents are thus effectively suppressed by the first doping region 221, resulting in a higher efficiency of the radiation generation.

The described configuration of a charge carrier barrier by a doping region having a particularly high doping concentration is particularly suitable for semiconductor layers, the band gap of which can no longer be easily increased by varying the composition of the group III atoms.

This application claims priority of DE 10 2016 123 262.9, the subject matter of which is incorporated herein by reference.

Our semiconductor bodies and methods are not restricted by the description on the basis of examples. Rather, this disclosure encompasses any new feature and also any combination of features, which includes in particular any combination of features in the appended claims, even if the feature or combination itself is not explicitly specified in the claims or examples.

The invention claimed is:

1. A radiation-emitting semiconductor body comprising a semiconductor layer sequence comprising an active region that generates radiation, an n-conducting semiconductor layer and a p-conducting semiconductor layer, wherein the active region is arranged between the n-conducting semiconductor layer and the p-conducting semiconductor layer and the p-conducting semiconductor layer comprises a first doping region with a first dopant and a second doping region with a second dopant different from the first dopant, and the p-conducting semiconductor layer comprises a further doping region doped with the first dopant and has a thickness of at most 2 nm.

2. The radiation-emitting semiconductor body according to claim 1, wherein the first doping region has a thickness of at most 2 nm.

3. The radiation-emitting semiconductor body according to claim 1, wherein the first dopant and the second dopant each effect a p-doping.

4. The radiation-emitting semiconductor body according to claim 1, wherein the semiconductor body is based on a III-V compound semiconductor material.

5. The radiation-emitting semiconductor body according to claim 4, wherein the first dopant is incorporated on group V lattice points.

6. The radiation-emitting semiconductor body according to claim 1, wherein the first dopant is carbon.

7. The radiation-emitting semiconductor body according to claim 6, wherein the second dopant is incorporated on group III lattice points.

8. The radiation-emitting semiconductor body according to claim 1, wherein the first doping region is arranged between the active region and the second doping region.

9. The radiation-emitting semiconductor body according to claim 1, wherein the first doping region and the second doping region directly adjoin one another.

10. The radiation-emitting semiconductor body according to claim 1, wherein the first doping region forms a charge carrier barrier for electrons.

11. The radiation-emitting semiconductor body according to claim 1, wherein the first doping region and the further doping region are spaced apart from one another by at most 5 nm.

12. A method of producing a semiconductor layer sequence comprising:
   a) providing a substrate; and
   b) growing a semiconductor layer sequence comprising an active region that generates radiation, an n-conducting semiconductor layer and a p-conducting semiconductor layer, wherein the active region is arranged between the n-conducting semiconductor layer and the p-conducting semiconductor layer and the p-conducting semiconductor layer comprises a first doping region with a first dopant and a second doping region with a second dopant different from the first dopant, and the p-conducting semiconductor layer comprises a further doping region doped with the first dopant and has a thickness of at most 2 nm.

13. The method according to claim 12, wherein the first doping region is deposited at a temperature of at most 600° C.

14. The method according to claim 12, wherein the semiconductor layer sequence is based on a III-V compound semiconductor material, and the first doping region is formed at a low III/V ratio.

15. The method according to claim 12, wherein the semiconductor layer sequence is based on a III-V compound semiconductor material and, to produce the first doping region, exclusively gas with the first dopant is supplied at least temporarily without feeding a further gas for the group III atoms and the group V atoms.

16. The method according to claim 12, in which a semiconductor body comprising a semiconductor layer sequence comprising an active region that generates radiation, an n-conducting semiconductor layer and a p-conducting semiconductor layer, wherein the active region is arranged between the n-conducting semiconductor layer and the p-conducting semiconductor layer and the p-conducting semiconductor layer comprises a first doping region with a first dopant and a second doping region with a second dopant different from the first dopant, and the p-conducting semiconductor layer comprises a further doping region doped with the first dopant and has a thickness of at most 2 nm is produced.

17. A radiation-emitting semiconductor body comprising a semiconductor layer sequence comprising an active region that generates radiation, an n-conducting semiconductor layer and a p-conducting semiconductor layer, wherein the active region is arranged between the n-conducting semiconductor layer and the p-conducting semiconductor layer and the p-conducting semiconductor layer comprises a first doping region with a first dopant and a second doping region with a second dopant different from the first dopant, and the second doping region is at least five times as thick as the first doping region, and the first doping region and the second doping region directly adjoin one another.

* * * * *